US011681846B1

United States Patent
Yang et al.

(10) Patent No.: US 11,681,846 B1
(45) Date of Patent: Jun. 20, 2023

(54) SUB-FPGA LEVEL COMPILATION PLATFORM WITH ADJUSTABLE DYNAMIC REGION FOR EMULATION/PROTOTYPING DESIGNS

(71) Applicant: XILINX, INC., San Jose, CA (US)

(72) Inventors: Xiaojian Yang, Santa Clara, CA (US); Frederic Revenu, San Carlos, CA (US); Dinesh D. Gaitonde, Fremont, CA (US); Amit Gupta, Los Altos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/147,163

(22) Filed: Jan. 12, 2021

(51) Int. Cl.
*G06F 30/343* (2020.01)
*G06F 30/347* (2020.01)

(52) U.S. Cl.
CPC .......... *G06F 30/343* (2020.01); *G06F 30/347* (2020.01)

(58) Field of Classification Search
CPC ............................ G06F 30/343; G06F 30/347
See application file for complete search history.

(56) References Cited

U.S. PATENT DOCUMENTS

| 7,530,045 | B1 * | 5/2009 | Kannan | G06F 30/34 |
| | | | | 716/101 |
| 10,608,641 | B2 | 3/2020 | Yu et al. | |
| 2017/0364621 | A1 * | 12/2017 | Lepercq | G06F 30/392 |
| 2020/0028511 | A1 * | 1/2020 | Yu | G06F 30/347 |
| 2020/0092230 | A1 | 3/2020 | Schultz et al. | |

OTHER PUBLICATIONS

Y. Xiao et al., "Reducing FPGA Compile Time with Separate Compilation for FPGA Building Blocks," 2019 International Conference on Field-Programmable Technology (ICFPT), 2019, pp. 153-161, doi: 10.1109/ICFPT47387.2019.00026. (Year: 2019).*

Vipin, K. et al., "FPGA Dynamic and Partial Reconfiguration: A Survey of Architectures, Methods, and Applications," ACM Computing Surveys, vol. 51, No. 4, Article 72, Jul. 2018, 39 pages.

Wernsman, Robert Cole, "Analyzing energy savings in an FPGA video processing system using dynamic partial reconfiguration," Iowa State University Capstones, Theses and Dissertations, https://lib.dr.iastate.edu/etd/17122, 2019, 39 pages.

Xilinx, "Partial Reconfiguration—Vivado Design Suite Tutorial," UG947 (v2019.1), Jun. 12, 2019, 148 pages, Xilinx, Inc., San Jose, California, USA,, retrieved from https://www.xilinx.com/support/documentation/sw_manuals/xilinx2019_1/ug947-vivado-partial-reconfiguration-tutorial.pdf.

* cited by examiner

*Primary Examiner* — Jack Chiang
*Assistant Examiner* — Aric Lin
(74) *Attorney, Agent, or Firm* — Patterson + Sheridan, LLP

(57) ABSTRACT

A method of FPGA compilation for an emulation system includes receiving a netlist for an FPGA, partitioning the netlist into a set of sub-FPGA netlists, and mapping each of the sub-FPGA netlists in the set to a corresponding dynamic sub-FPGA region of the FPGA. The method further includes implementing the sub-FPGA netlists of the set in parallel to obtain a corresponding set of sub-FPGA bitstreams.

4 Claims, 12 Drawing Sheets

SUB-FPGA LEVEL COMPILATION PLATFORM WITH ADJUSTABLE DYNAMIC REGION FOR EMULATION/PROTOTYPING DESIGNS

TECHNICAL FIELD

Embodiments of the present invention generally relate to partial reconfiguration of FPGAs, and in particular to a Sub-FPGA level compilation platform with adjustable dynamic region.

BACKGROUND

Hardware emulation is the process of debugging and functional verification of a system in development. Comprehensive hardware functional verification is critical to reduce development cost and time-to-market. Emulation provides quick bring-up and quick turn-around time when processing design changes. Also, emulation provides high design accessibility and debug visibility so that application specific integrated circuit (ASIC) designers can catch potential hardware failures before the tape out. As software complexity and cost are drastically increasing, early hardware verification is essential to lower risk and accelerate system development.

As designs become larger and more complex, traditional emulation systems have difficulties when trying to map an ASIC into a limited number of FPGAs. FPGA-based emulation systems that have too many FPGAs are both costly as well as outperformed by other types of emulation systems. The appearance of very large FPGAs, such as, for example, Xilinx' VU19P, have helped to alleviate this problem. Due to the continuously increasing capacity of large commercial FPGAs (with capacities of 10M logic cells or more), emulation systems built on these larger FPGAs are able to scale up to accommodate larger ASIC designs without a significant increase of the number of FPGAs per system.

Notwithstanding the advantages of large FPGA based emulation systems, compile time, namely the time needed for mapping ASIC designs into the FPGAs of the emulation system, has become a major obstacle to ASIC designers seeking to adopt emulation systems based on larger FPGAs. In general, the compile time of an emulation design is determined by two stages. An initial stage includes the process of partitioning the entire ASIC design netlist into a number of sub-netlists, where each sub-netlist can fit into a single FPGA. The second stage involves mapping each sub-netlist onto the single FPGA. It is noted in this context that a typical sub-netlist size is 4 million instances. For such a netlist, FPGA mapping flow, including retargeting, logic optimization, placement, physical optimization and routing, can take a very large amount of time. Current FPGA implementation tools spend an average of 8-10 hours on these tasks. When the netlist is complex, implementation tools tend to spend even more time on such tasks, for example as much as twenty hours. As such a long runtime is unacceptable to emulation system users, the critical problem that may determine whether FPGA based emulation systems will survive in the market, or not, involves reducing FPGA mapping runtime.

What is needed are systems and related methods to address the above-described problems and obstacles of the prior art.

SUMMARY

Methods for more efficient FPGA compilation are described herein. In one example, a method of FPGA compilation for an emulation system includes receiving a netlist for an FPGA, partitioning the netlist into a set of sub-FPGA netlists, and mapping each of the sub-FPGA netlists in the set to a corresponding dynamic sub-FPGA region of the FPGA. The method further includes implementing the sub-FPGA netlists of the set in parallel to obtain a corresponding set of sub-FPGA bitstreams.

In one example, the method further includes loading the set of sub-FPGA bitstreams into the FPGA, and creating a functional FPGA for the emulation system. In one example, the method further includes dividing the FPGA into a set of M sub-FPGA regions, where M is an integer that is a power of 2.

In another example, an FPGA based emulation prototyping platform is described herein. In one example, the FPGA based emulation prototyping platform includes a first set of upper level sub-FPGA dynamic regions. The platform further includes a second set of lower level sub-FPGA dynamic regions, where each of the upper level sub-FPGA regions comprises two or more of the lower level sub-FPGA regions of the first set. The platform still further includes a routing region, where a portion of the routing region is adjacent to each of the upper level regions of the first set.

In another example, a portion of the routing region is also adjacent to each of the lower level sub-FPGA dynamic regions in the second set.

In another example, a method of sub-FPGA region selection for a multiple level FPGA includes partitioning an FPGA netlist into a first set of sub-FPGA netlists, such that each sub-FPGA netlist in the set fits within an upper-level sub-FPGA region. The method further includes, for each sub-FPGA netlist in the set, further partitioning the sub-FPGA netlist into sub-sub-FPGA netlists, and determining if the number of interconnects between the sub-sub-FPGA netlists are below a pre-defined capacity. The method still further includes adopting the further partitioning if the interconnect capacity is met, and assigning the sub-sub netlists to a lower level dynamic sub-FPGA region, or rejecting the further partitioning if the interconnect capacity is exceeded, and assigning the sub-FPGA netlist to an upper level dynamic sub-FPGA region, and obtaining a final partitioning comprising upper level sub-FPGA netlists and lower-level sub-FPGA netlists.

BRIEF DESCRIPTION OF THE DRAWINGS

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

To facilitate understanding, identical reference numerals have been used, where possible, to designate identical elements that are common to the figures. It is contemplated that elements of one embodiment may be beneficially incorporated in other embodiments.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

In one or more examples, improvements to large FPGA compilation for Emulation/Prototyping systems are described. In some examples, Dynamic Functional exchange (DFX) technology is adopted to build the platform consisting of multiple nested sub-FPGA regions. In some examples, a partitioning step breaks a full FPGA netlist into sub-FPGA netlists, and dynamically determines sub-FPGA region size. In some examples, global routing may then be called to implement the interconnects between sub-FPGAs. Each sub-FPGA is compiled under an abstract shell mode to save compile time. In addition, hierarchical sub-FPGA regions may be used to give partitioner flexibility on determining sub-FPGA netlist size. Furthermore, the global routing between sub-FPGAs can be implemented after partitioning using nested DFX region technology. In one or more examples, all sub-FPGA compilation jobs may be run in parallel. Compared to conventional full FPGA compilation, process flow according to one or more examples can achieve a 3×-5× reduction in compile time. This makes FPGA-based emulation/prototyping system competitive on compile time while maintaining 2× or more performance advantage, over ASIC based emulation systems.

Figure 1A:
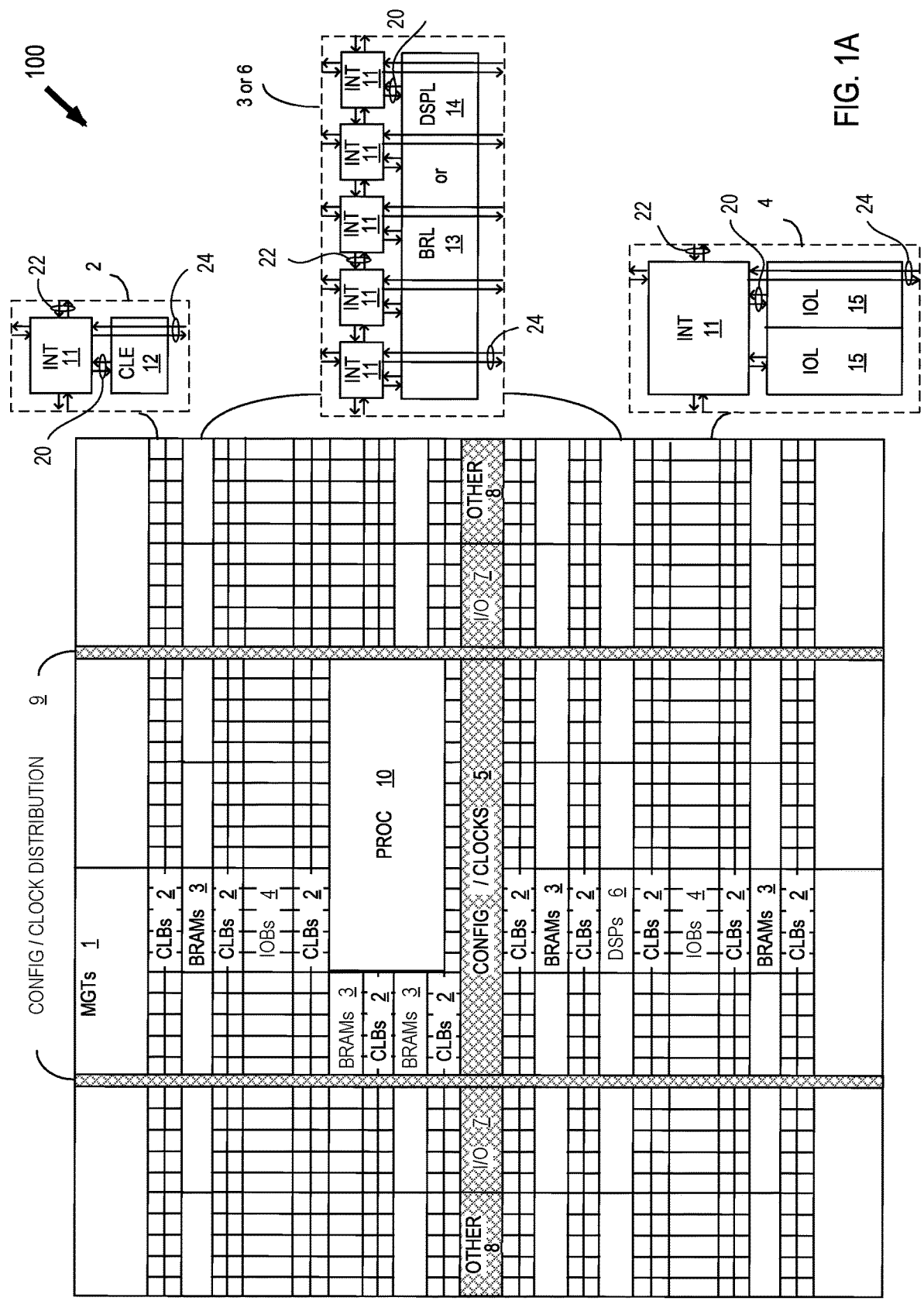
FIG. 1A illustrates an example field programmable gate array ("FPGA"), according to an example.

As noted above, in one or more examples, an FPGA may be partitioned into sub-FPGA regions and those sub-regions implemented in parallel. FIG. 1A illustrates an example FPGA architecture that may be so partitioned. With reference thereto, FPGA 100 includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 1A. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 1A) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

It is noted that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 1B:
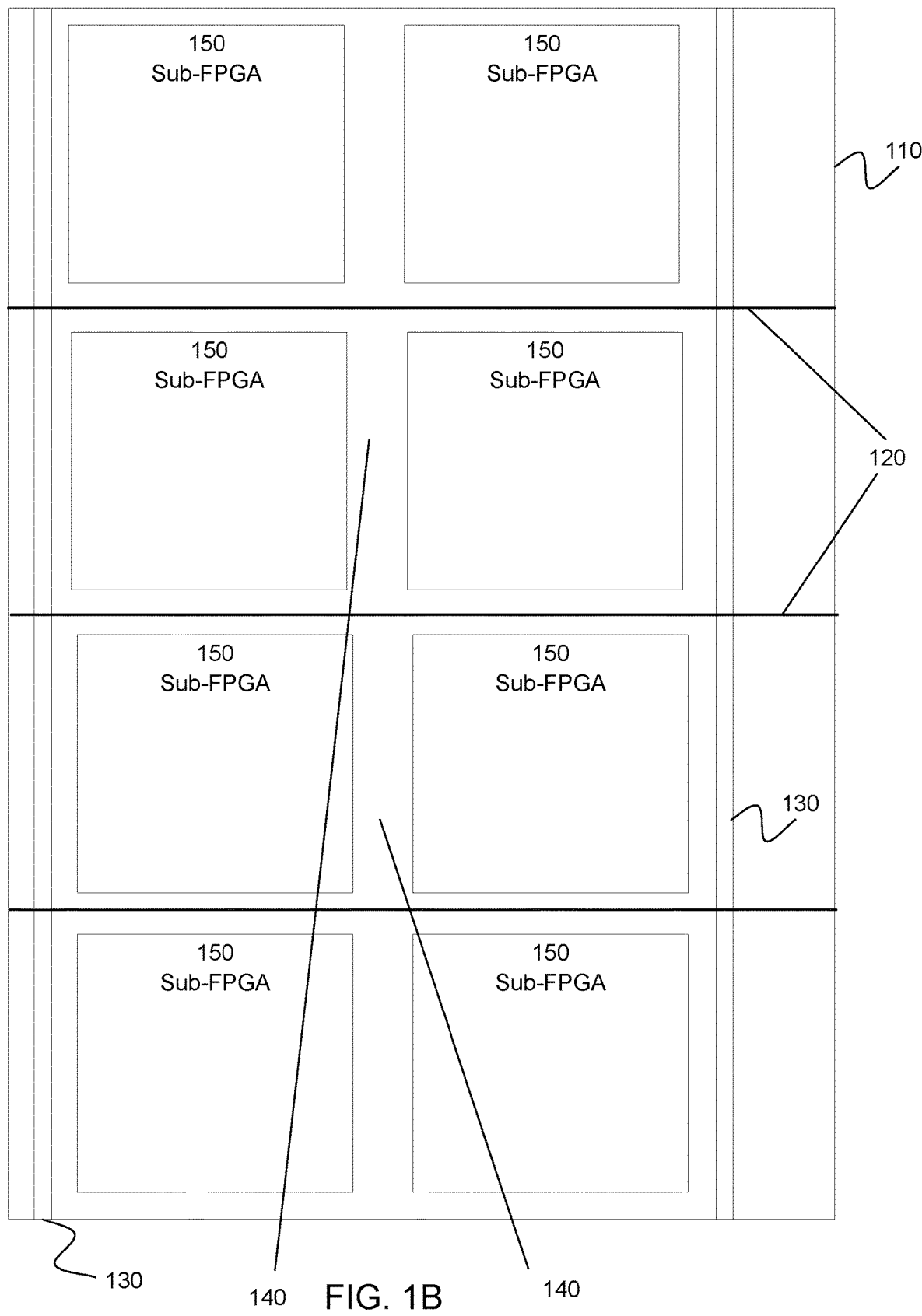
FIG. 1B illustrates an example division of an FPGA including a platform and several sub-FPGA regions, according to an example.

FIG. 1B illustrates an example division of an example FPGA 110, in accordance with one or more examples. The exemplary FPGA 110 is divided into eight dynamic sub-FPGA regions 150. These eight regions are surrounded by a static region 140. Also shown in FIG. 1B are "super logic region" (SLR) boundaries 120. This term refers to the situation where an FPGA is made of several dies, each provided on an interposer, as is done using stacked silicon interconnect (SSI) technology. The dies may be known as SLRs, and thus the boundaries between the dies as SLR boundaries. In this particular example, none of the sub-FPGA regions crosses an SLR boundary, but it is noted that this is merely exemplary, and is not, in general, a requirement or constraint. Finally, the example FPGA 110 also includes two input/output (I/O) columns 130.

Figure 2:
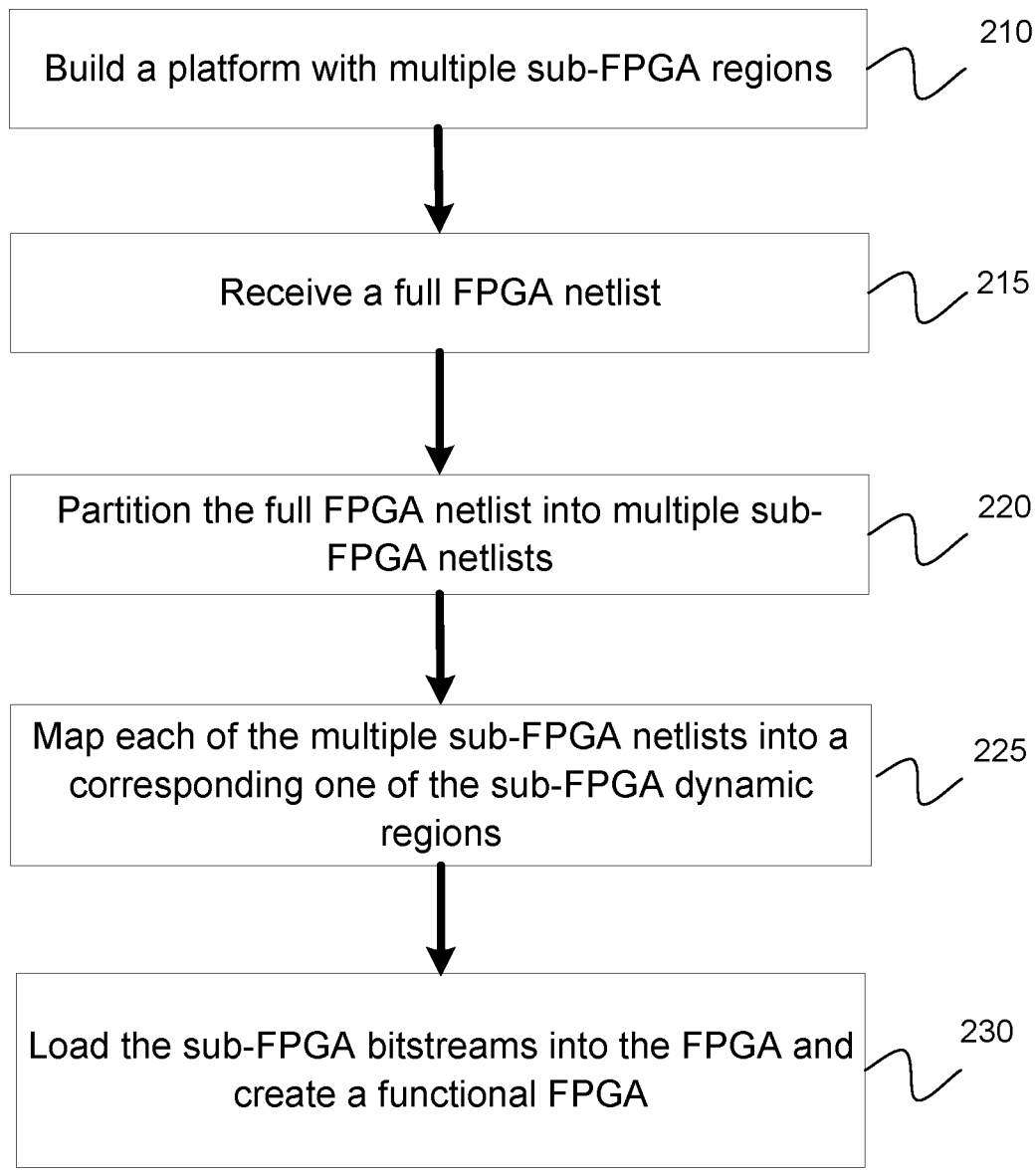
FIG. 2 illustrates a flow diagram of a method for sub-FPGA compiling, according to an example.

FIG. 2 illustrates a process flow diagram of a method 200 for FPGA compilation for an emulation system, according to an example.

Continuing now with reference to FIG. 2, method 200 includes blocks 210 through 230. In alternate examples method 200 may include greater, or fewer, blocks. Method 200 begins at block 210, where a platform is built with multiple sub-FPGA regions. As noted above, in one or more examples the sub-FPGA regions are dynamic regions. For example, these may be sub-FPGA regions 150 of FIG. 1B. In one or more examples, the number of dynamic regions may be 4, 8, 16, or other power of two. In some examples the platform may be built using the FPGA partial reconfiguration dynamic function exchange (DFX) technology provided by Xilinx, Inc., of San Jose, Calif.

Continuing with reference to FIG. 2, from block 210 process flow moves to block 215, where a full FPGA netlist is received. From block 210 process flow moves to block 215, where the full FPGA netlist is modified and partitioned into multiple sub-FPGA netlists.

From block 215 process flow moves to block 220, where each of the sub-FPGA netlists is mapped into one of the sub-FPGA regions. Additionally, as a part of this process, global routing between the sub-FPGAs is conducted, and additional interconnects may be added to maintain the connectivity of the original FPGA netlist.

From block 220 process flow moves to block 225, where each of the multiple sub-FPGA netlists are mapped into a corresponding one of the sub-FPGA regions. This may be done, for example, by calling multiple FPGA implementation jobs, and running each job on a tailored (reduced) netlist, or as is referred to in the DFX technology, under an abstract shell mode. This approach provides a significant compile time reduction relative to compiling a full FPGA netlist.

After all of the implementation jobs called in block 225 are completed, from block 225 process flow moves to block 230, where all of the sub-FPGA bitstreams are loaded into the FPGA, thereby creating a functional FPGA for the emulation system.

It is noted with reference to the method of FIG. 2 that a significant processing time advantage is obtained by breaking the time consuming conventional FPGA implementation process into a set of smaller jobs. Each of the smaller jobs runs a lot faster, and all of the jobs can run in parallel. The reduced netlist size not only speeds up the implementation (whose speed is a function of netlist size), but also reduces the complexity of implementation in two aspects. Firstly, the reduced netlist size reduces global congestion, which is usually caused by lots of overlapping global wires (wires that have many fanouts or driver/loads have to be placed far away). Routing complexity on the FPGA is greatly reduced if global congestion is low. Secondly, it avoids the complexity of handling inter-die nets. In today's SSI devices a large portion of runtime is spent on optimization of crossing-die nets.

Additionally, in one or more examples a large advantage in memory usage may be realized. This is because each individual sub-FPGA netlist is a lot smaller than a full original FPGA netlist, so the overall compilation process uses a lot less peak memory. This provides an additional compile time advantage with a smaller memory footprint. For example, in one example implementation of the process illustrated in FIG. 5, described below, the sub-netlist size was about ⅛ of the full netlist size. Thus, a partitioner will aim to partition the full netlist into equal sub-netlists. The memory consumption of the compilation process is proportional to the netlist size.

However, in some contexts the division of an FPGA into multiple dynamic sub-FPGA regions may have a drawback. When the size of the sub-FPGA region is fixed, a large module in a given design under test (DUT) may be forced to split into two sub-FPGA regions. This may frequently happen as modern DUTs often contain large function units. When modules have strong internal connectivity, splitting them requires a large number of interconnects between sub-FPGAs, thereby lowering emulation system performance.

Figure 3A:
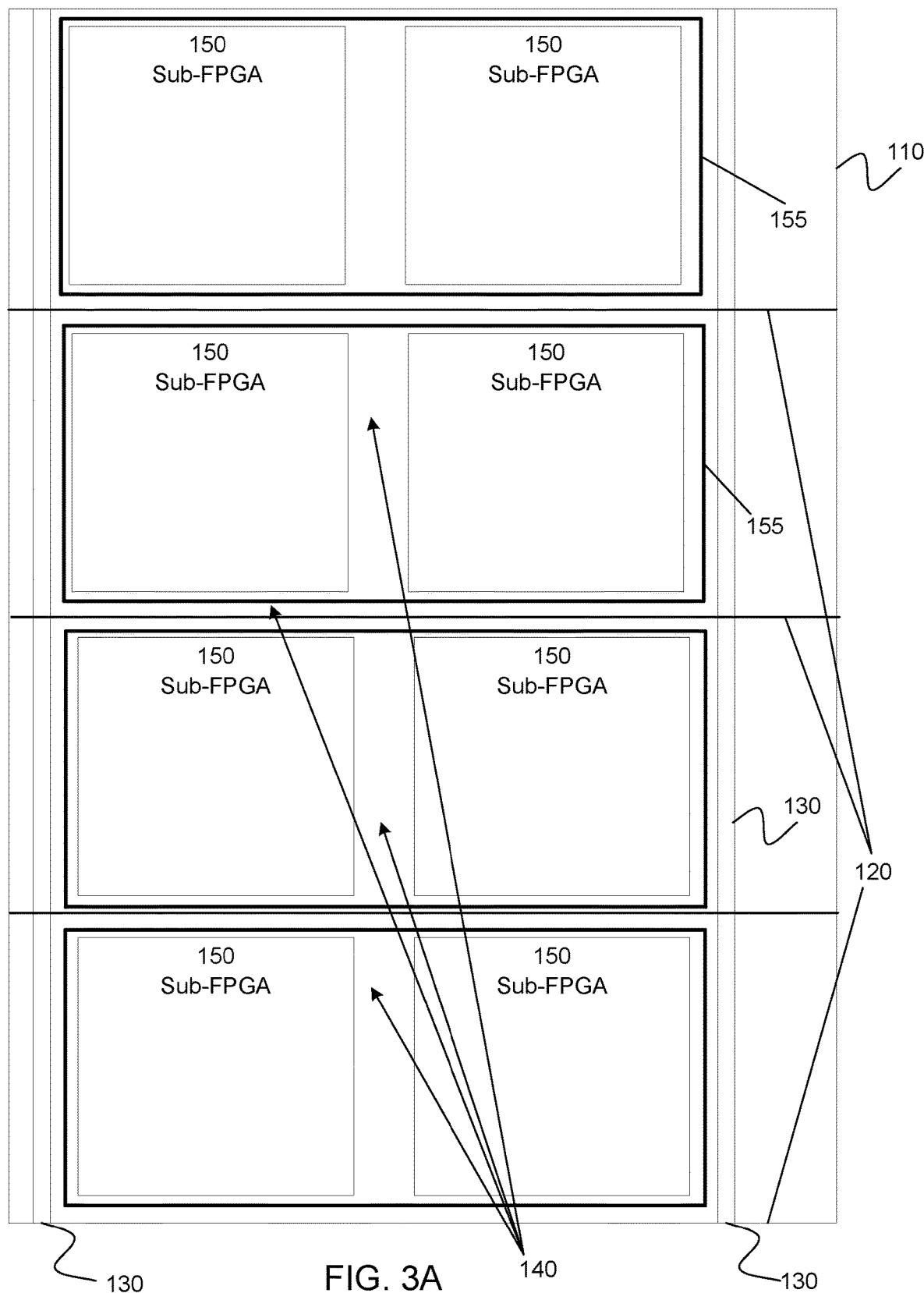
FIG. 3A illustrates a first example two-level sub-FPGA platform with nested dynamic regions, according to an example.
Figure 3B:
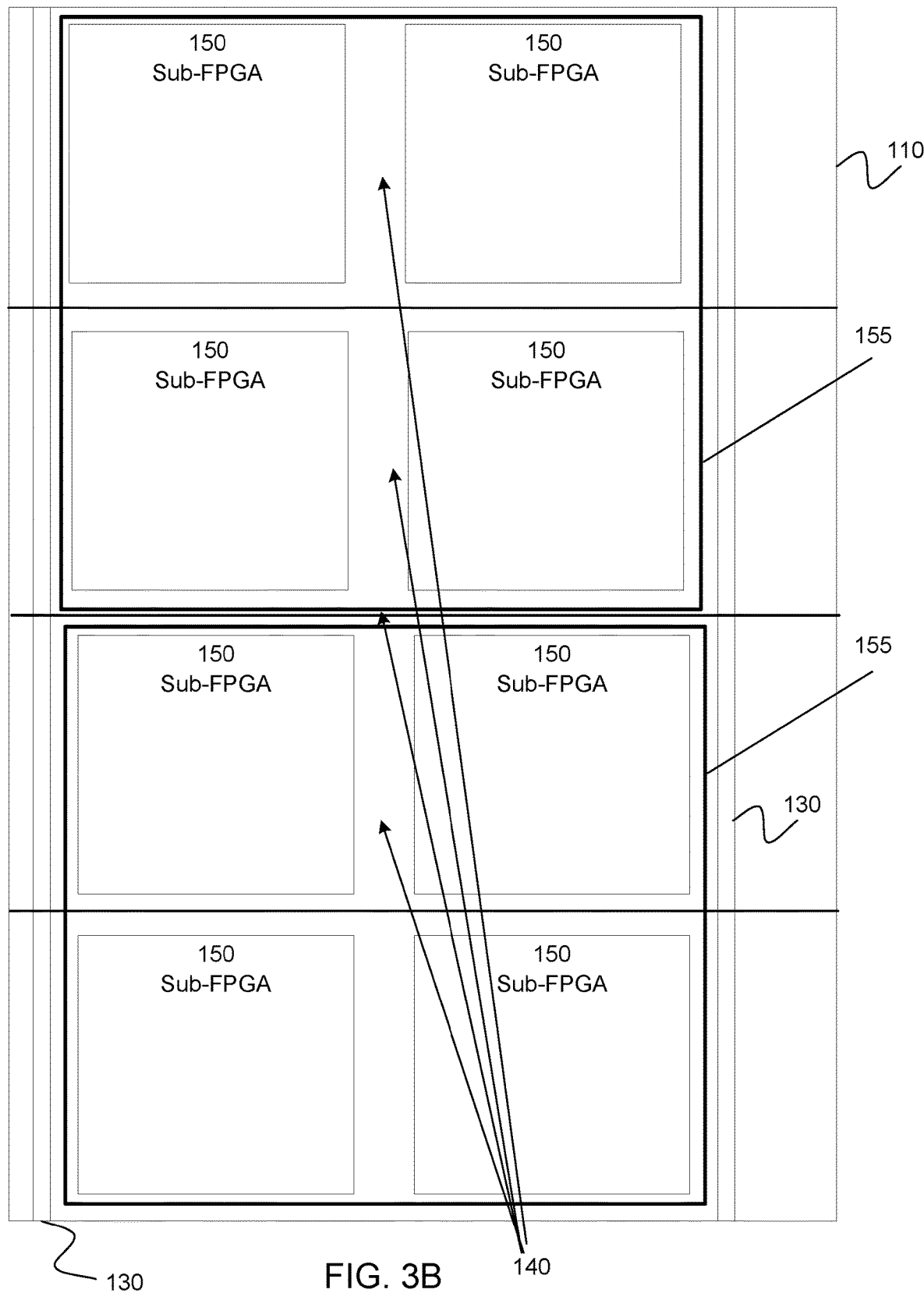
FIG. 3B illustrates a second example two-level sub-FPGA platform with nested dynamic regions, according to an example.
Figure 3C:
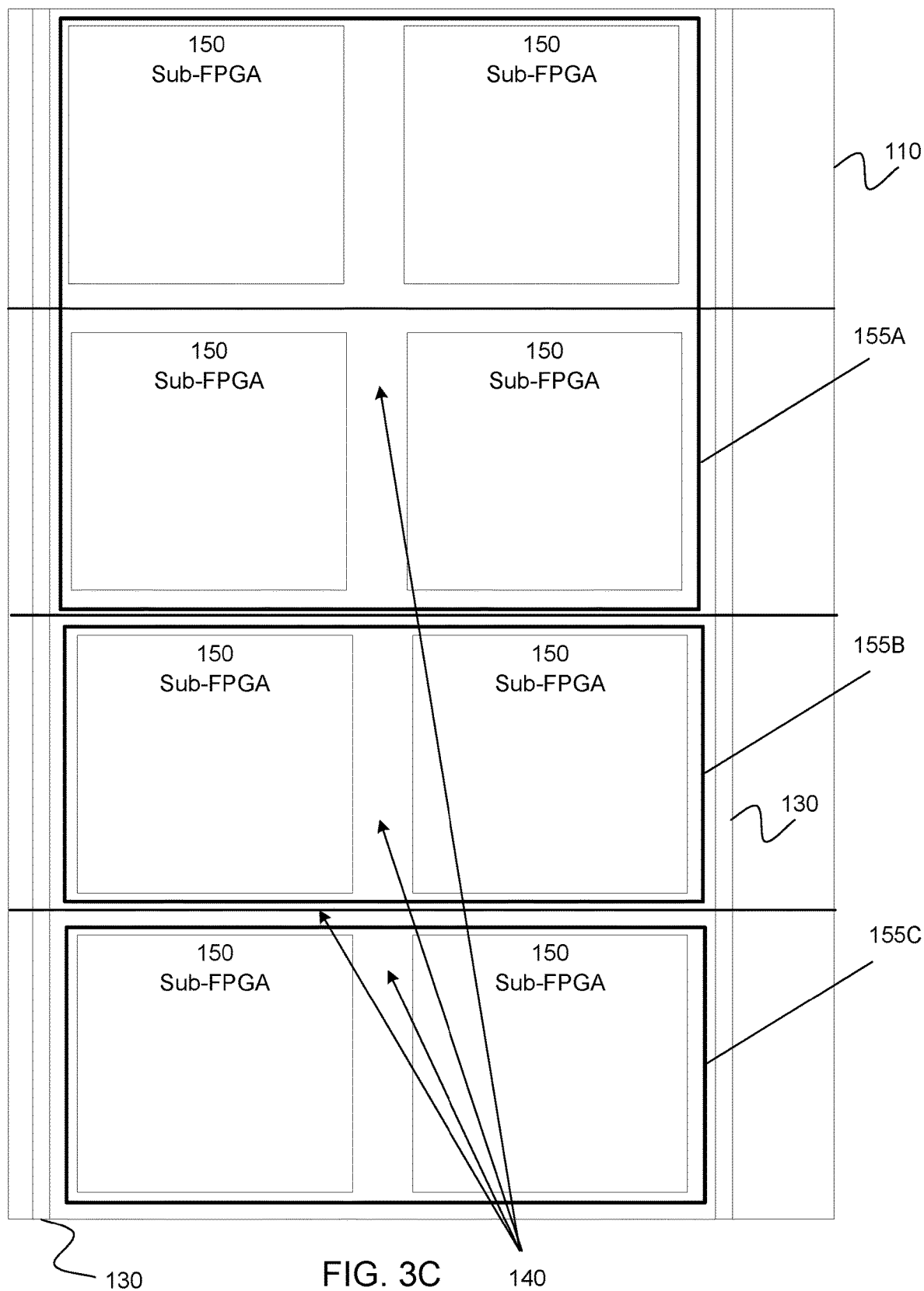
FIG. 3C illustrates a third example two-level sub-FPGA platform with nested dynamic regions, according to an example.

To address this problem, in one or more examples, a platform that allows an operator to provide nested dynamic regions may be used. Specifically, in one or more examples, an example sub-FPGA platform may be provided with multiple levels of dynamic regions, such as, for example, an upper level and a lower level. In one or more examples, upper level sub-FPGA regions may be larger, and may be, for example, SLR based regions, provided between (and thus not crossing over) SLR boundaries. In one or more examples, lower level sub-FPGA regions may be smaller, and may be contained within the upper level sub-FPGA regions. FIGS. 3A through 3C, next described, illustrates various examples of two levels of dynamic regions, according to one or more examples.

In the description of figures that follows, only differences form the example of FIG. 1B are described. Elements which are unchanged are not repeated. With reference to FIG. 3A, an example two-level sub-FPGA platform with nested dynamic regions is illustrated, according to a first example. In the example of FIG. 3A there are four upper level dynamic regions 155, each provided between SLR borders 120. Within each upper level dynamic region 155 are provided two lower level sub-FPGA regions 150. Surrounding both the upper level dynamic regions 155, and the lower level regions 150 is static region 140.

Continuing with reference to FIG. 3B, in the example of FIG. 3B there are now two larger upper level dynamic regions 155, which, in this example, comprise two SLRs each. Within each upper level dynamic region 155 there are provided four lower level dynamic regions 150, and these lower level dynamic regions 150 do not, in this example, cross over SLR boundaries. Surrounding both the two upper level dynamic regions 155, and the lower level regions 150 within each upper level dynamic region 155, is static region 140.

Continuing with reference to FIG. 3C, in the example of FIG. 3C there are now three larger upper level dynamic regions 155A, 155B and 155C. In this example, the upper level dynamic regions are not the same size, and thus the upper level dynamic region 155A, including four lower level dynamic regions 150, is twice the size of each of upper level dynamic regions 155B and 155A, which, in this example, comprise two lower level dynamic regions 150 each. As in the examples described above, the lower level dynamic regions 150 do not, in this example of FIG. 3C, cross over SLR boundaries either. Surrounding both the three upper level dynamic regions 155A, 155B and 155C, and the various lower level regions 150 within each upper level dynamic region 155, is static region 140.

In the examples of FIGS. 3A, 3B and 3C, during the full FPGA netlist partitioning stage (e.g., block 220 of FIG. 2), the partitioner has the flexibility to choose an appropriate size of the sub-FPGA regions. In particular, for example, in a first part of the parititioning stage, the received full FPGA netlist is split into four sub-FPGA netlists that can each fit into an upper-level sub-FPGA region 155, as shown in FIG. 3A, for example. In a second part of the parititioning stage, the parititoner then starts to split the sub-FPGA netlists in each upper level dynamic region even further, into sub-sub-FPGA netlists. If a further splitting gives a good (e.g., not too many) number of interconnects between the sub-sub-FPGA netlists, the partitioner may accept this splitting and assign each of the two sub netlists into one lower level sub-FPGA region 150 of each upper level dynamic sub region 155.

However, for any of the upper level dynamic regions 155, if any second stage splitting results in too large a number of interconnects between two sub-sub netlists, the partitioner can stop this second splitting and assign the current sub netlist into the corresponding upper sub-FPGA region 155.

Thus, in one or more examples the result of the partitioning of the full FPGA netlist may be a mix of both upper-level sub-FPGA netlists 155 and lower-level sub-FPGA netlists 150, for any of the examples of FIGS. 3A through 3C.

Figure 4:
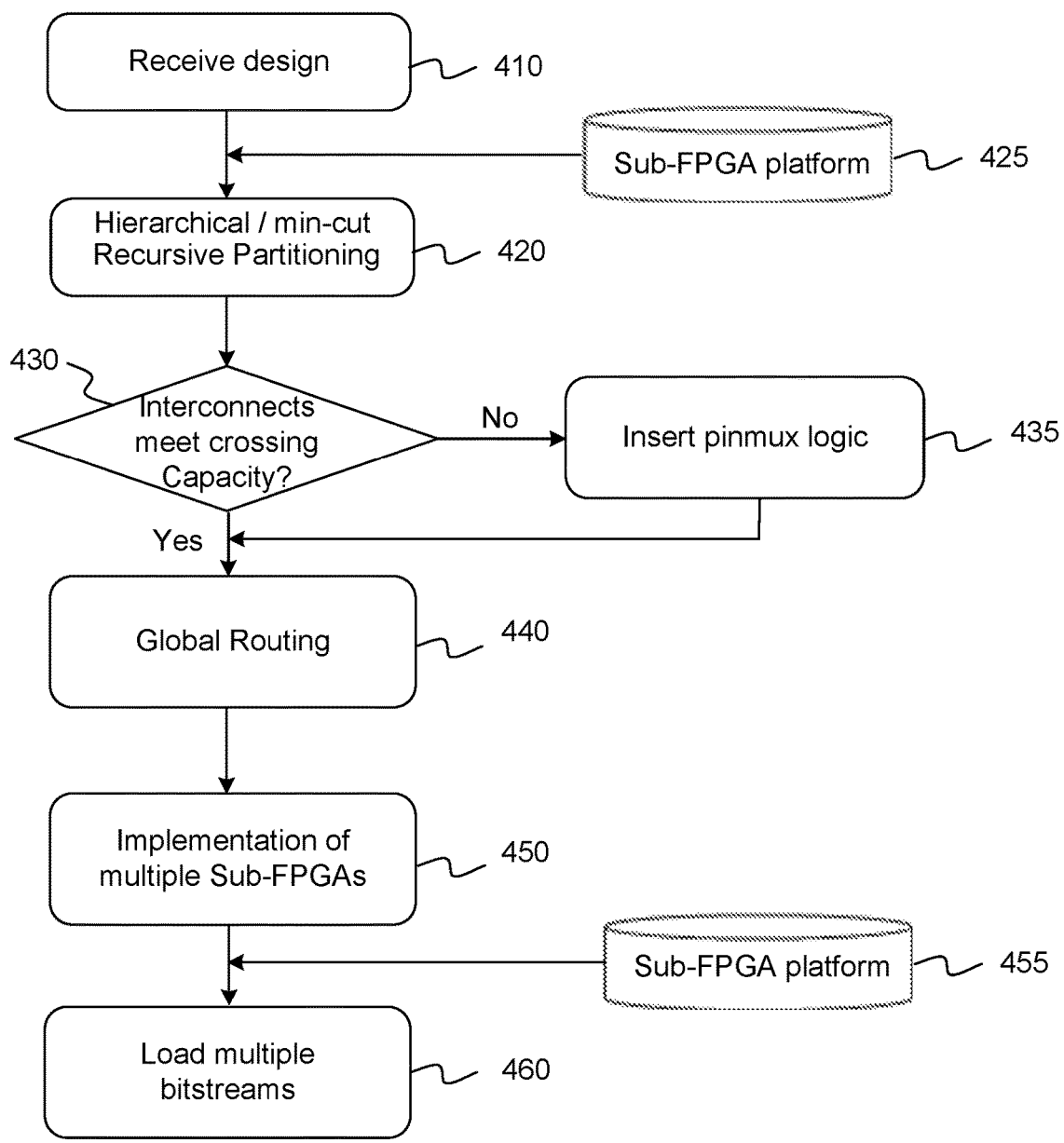
FIG. 4 is a flow diagram of a method for sub-FPGA compilation, according to an example.

FIG. 4 is a flow diagram of a method for sub-FPGA compilation, according to an example. The process flow illustrated in FIG. 4 is a similar to, but more detailed than, the example process flow illustrated in FIG. 2. Continuing with reference to FIG. 4, method 400 includes blocks 410 through 40. In alternate examples method 400 may include greater, or fewer, blocks. Method 400 begins at block 410, where a design for an FPGA is received. For example, the design may be a FPGA level netlist. From block 410 method 400 proceeds to block 420, where an attempt is made to partition the full netlist in a recursive fashion. As shown, the partitioning at block 420 is informed by information about the sub-FPGA platform 425. This information may include, for example, boundary-crossing capacity (so as to be able to judge if capacity has been met or not), and number of sub-FPGA regions (so as to determine when to stop the recursive partitioning). Thus, for example, at block 420, each time the netlist is divided into two sub-netlists, which may be each termed "sub(1)-netlists", where the number in parentheses refers to a level of division, each of the sub(1)-netlists is then further divided into two sub(2)-netlists, and so on. By this recursive division, the number of partitions of the original netlist is initially 2, then 4, then 8, etc., or $2^K$ for each level of partitioning K, where K is a positive integer.

As indicated in block 420, there are two ways to partition each sub-netlist that may be used in block 420, namely hierarchical and min-cut. Hierarchical partitioning refers to finding the partition by design hierarchies (modules), and min-cut partitioning attempts to find a partition such that the number of interconnects between two resultant sub-netlists is minimized.

From block 420, method 400 proceeds to query block 430, where the number of interconnects between the sub-netlists generated in block 420 is measured, and it is determined if the number of interconnects is within the boundary crossing capacity. If a "No" is returned at query block 430, then method 400 proceeds to block 435, where pinmux logic is inserted, which includes inserting multiplexer (mux) and demultiplexer (demux) logic to allow the limited boundary-crossing wires to pass the signals from one sub-netlist to another. In one or more examples, sending signals are be grouped using mux logic, and receiving signals use demux logic to restore the signals.

If a "Yes" is returned at query block 430, or, alternatively, if a "No" was originally returned at query block 430, and method 400 proceeded to block 435 and the pinmux logic was inserted, method 400 proceeds from either block 430, or from block 435, as the case may be, to block 440. At block 440 global routing is provided to route all connections between the various sub-FPGA dynamic regions.

From block 440 method 400 proceeds to block 450, where the multiple sub-FPGAs are implemented. As was the case in block 225 of FIG. 2, this refers to a mapping of each of the multiple sub-FPGA netlists into a corresponding one of the sub-FPGA dynamic regions. As shown by block 455, this mapping takes as one of its inputs the sub-FPGA platform, including the various sub-FPGA dynamic regions.

After all of the sub-FPGAs are implemented in block 450, from block 450 method 400 moves to block 460, where the multiple sub-FPGA bitstreams are loaded into the FPGA, thereby creating a functional FPGA for the emulation system.

Figure 5:
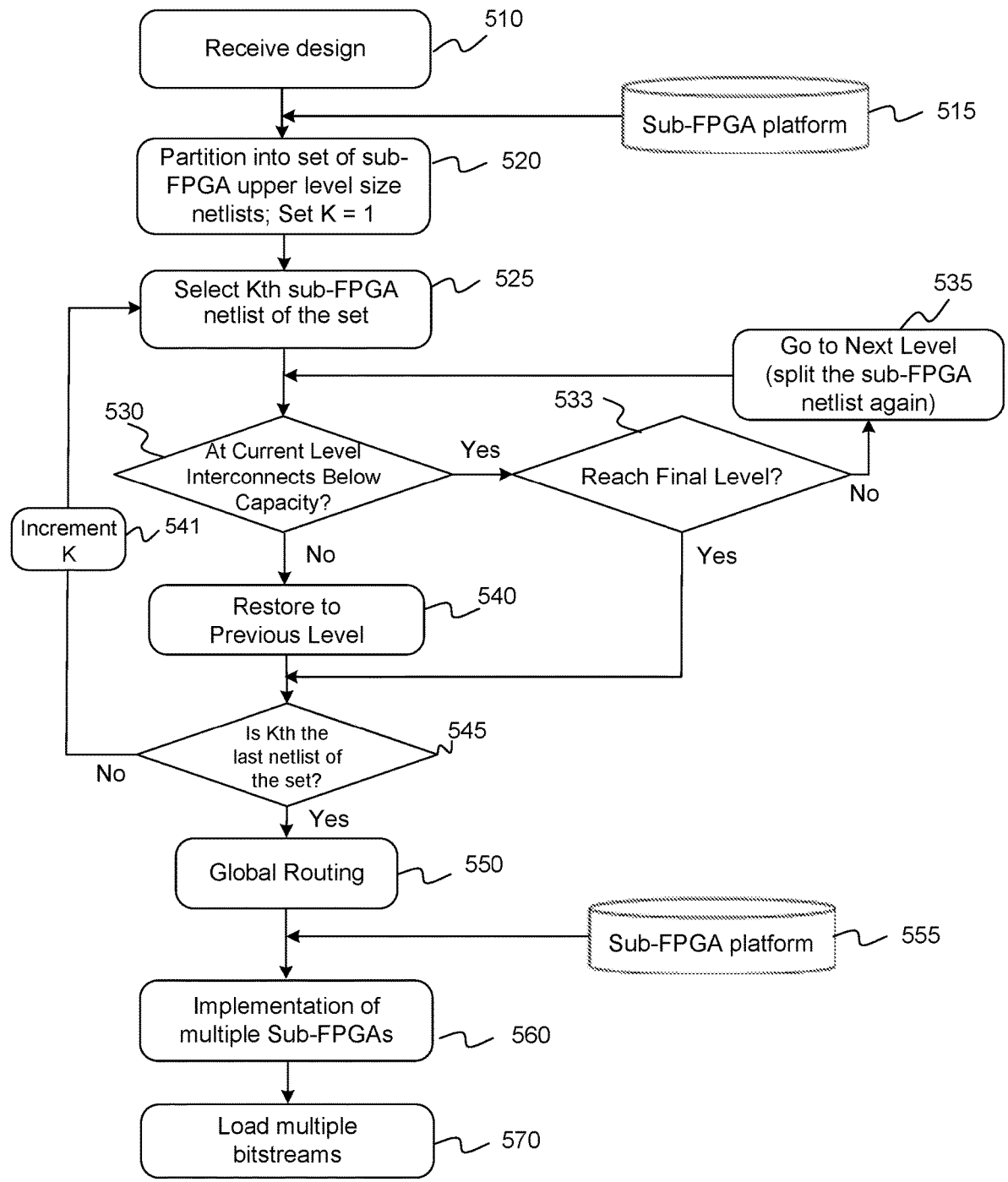
FIG. 5 is a flow diagram of a method for split compilation with dynamic partitioning, according to an example.

As noted above with reference to FIGS. 3A through 3C, an FPGA platform according to one or more examples may include nested dynamic regions, where there are, for example, two levels of dynamic regions, with larger upper levels, and smaller lower levels. FIG. 5 is a flow diagram of a method 500 for split compilation with dynamic partitioning, which allows a partitioner to dynamically decide how many levels of partitioning to implement, according to an example. Continuing with reference to FIG. 5, method 500 includes blocks 510 through 570. In alternate examples method 500 may include greater, or fewer, blocks. Method 500 begins at block 510, where a design for an FPGA is received. For example, the design may be a FPGA level netlist. From block 510 method 500 proceeds to block 520, where, based on a sub-FPGA platform 515, the design is partitioned into a set of sub-FPGA upper level size netlists. For example, there may be two, three of four upper level size netlists, corresponding to any of the examples illustrated in FIGS. 3A through 3C. Additionally, a counter for the set K is set to 1. At block 520 method 500 obtains information from sub-FPGA platform 515 to facilitate method 500 making necessary decisions at subsequent blocks 530 and 533 of method 500. In one or more examples, the information provided by sub-FPGA platform 515 includes number of sub-FPGA regions, size of the sub-FPGA regions, and boundary-crossing capacity.

From block 520 method 500 proceeds to block 525, where the Kth sub-FPGA netlist of the set is selected. Selection of a sub-FPGA netlist is the first block of the loop comprising blocks 525 through 545, next described. Initially, when K=1, the selection at block 525 will select the $1^{st}$ sub-FPGA netlist. From block 525 method 500 proceeds to query block 530, where it is determined if the number of interconnects based on the current level are below the interconnect capacity. For a first time through this loop, a given sub-FPGA netlist will always be at an upper level. If a Yes is returned at query block 530, then method 500 proceeds to query block 533, where it is determined if the final sub-FPGA level has been reached. It is noted that in one or more examples, as shown in FIGS. 3A through 3C, there are only two possible levels, upper and lower, but not more. Thus, for a first time through query block 533, when the only yet defined level is the upper one, the response will be "No." Then method 500 proceeds to block 535 and the sub-FPGA netlist is further split, for example into two lower level sub-sub-FPGA netlists, and process flow returns to query block 530, for another pass through query block 533. If, however, in response to query block 533 a "Yes" was returned, and the final level of sub-FPGA netlists has already been reached, then even though there may be more interconnect capacity, process flow nonetheless proceeds to query block 545.

If, on the other hand, at query block 530 a "No" was returned, which generally does not occur on the first pass through the query block, then the interconnects required to implement the then current level, e.g., netlists of lower level size, are so many as to exceed the interconnect capacity, then method 500 proceeds to block 540, where the previous (next highest) level is restored, the further split of the upper level sub-FPGA netlist thus undone, and method 500 next proceeds to query block 545, where all process flow through the loop eventually end up. It is noted that the sub-netlist splitting occurs together with sub-region splitting. When the sub-netlist splitting is undone, the corresponding region is also reverted back to the previous region of the sub-netlist before splitting. Thus, for example, at block 540, when the previous (upper) level is restored, then the two sub-FPGA lower level regions 150 of the upper level region 155 to which they belong are fused, and no longer there. When this occurs, a single upper level region may have no lower level sub-FPGA regions In one or more examples, when this occurs, lower level regions 150 in upper level region 155B or 155C may be combined into one single dynamic region. At query block 545 it is determined if the current Kth sub-FPGA upper level netlist of the set is the last one. If Yes, then all elements of the set have been processed, and method 500 proceeds to block 550. If the response at query block 545 is No, then there are additional elements of the set to process, and method 500 first proceeds to block 541, where the value of K is incremented, and then returns to block 525, where the next element of the set is selected.

When all elements of the set of sub-FPGA upper level netlists that were generated at the partitioning of block 520 have been processed, there will be a resultant partitioning of the original FPGA design into a mix of both upper-level sub-FPGA netlists and lower-level sub-FPGA netlists. At that point, method 500 proceeds to block 550 where global routing is provided to route all connections between the various sub-FPGA dynamic regions, both upper level and lower level.

From block 550 method 500 proceeds to block 560, where the multiple sub-FPGAs are implemented. As noted above, this refers to a mapping of each of the multiple sub-FPGA netlists into a corresponding one of the sub-FPGA dynamic regions. As shown, this mapping takes as one of its inputs the sub-FPGA platform 555, and it is performed, to the extent possible, in parallel, due to the upper and lower levels of sub-FPGA netlists.

After all of the sub-FPGAs are implemented in block 560, from block 560 method 500 moves to block 570, where the multiple sub-FPGA bitstreams are loaded into the FPGA, thereby creating a functional FPGA for the emulation system, that may be partitioned at a significant decrease in compile time.

Figure 6:
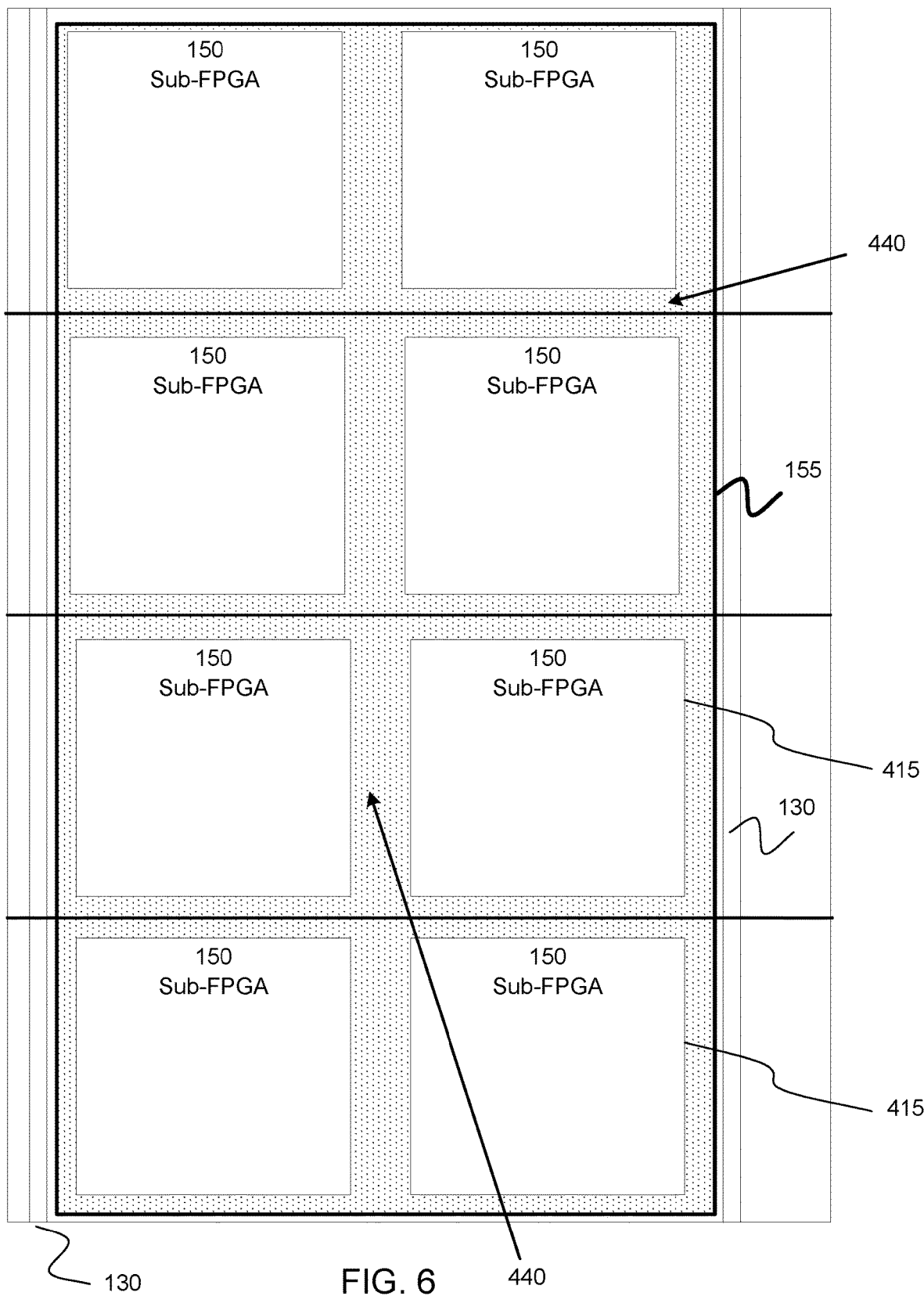
FIG. 6 illustrates an example sub-FPGA platform with nested dynamic regions, according to an example.
Figure 7:
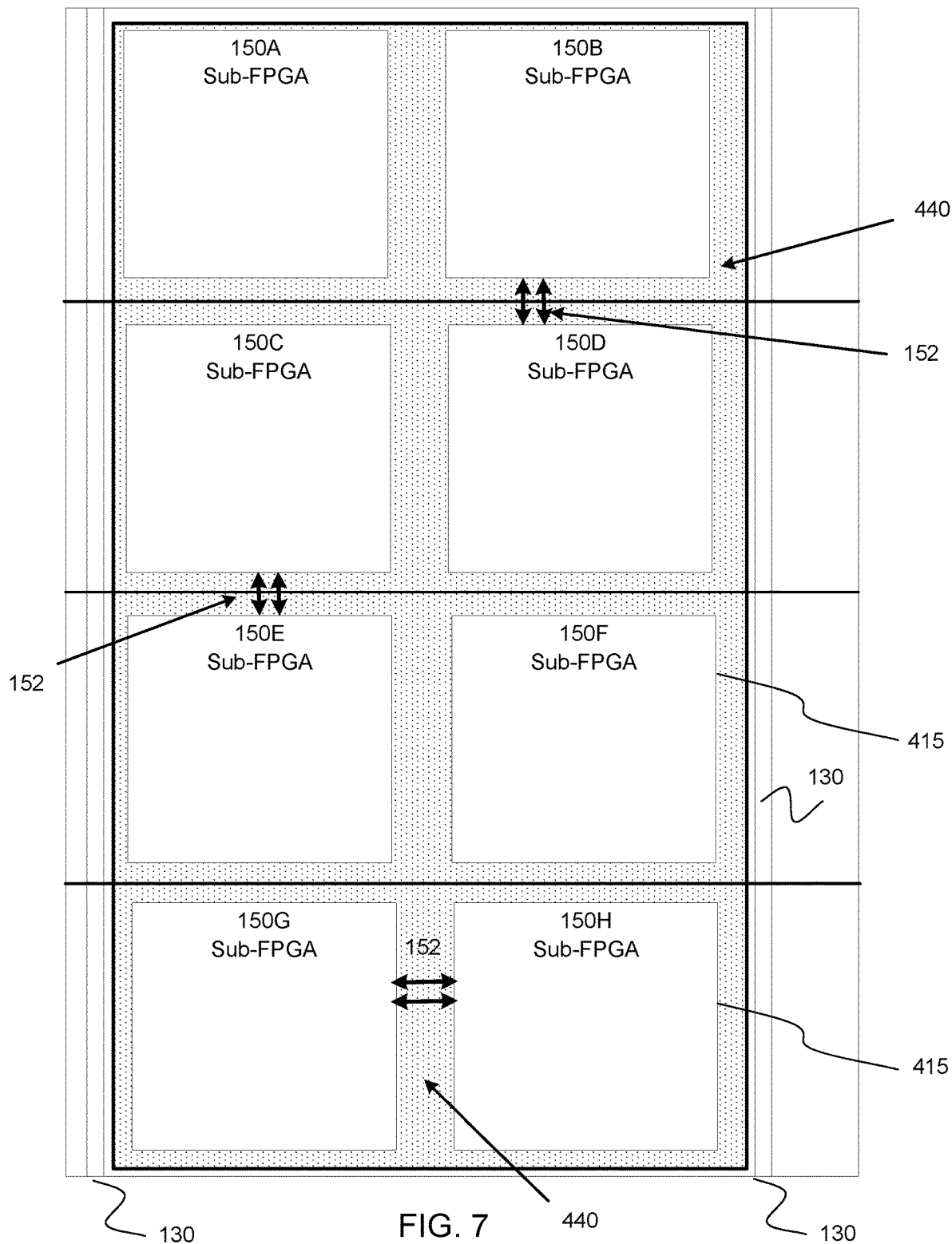
FIG. 7 illustrates the example sub-FPGA platform of FIG. 8, with the addition of multiplexing between individual regions, according to an example.

FIGS. 6 and 7, next described, illustrate alternate examples that embody another improvement to a sub-FPGA compile platform. This feature involves making the interconnects dynamic, based on the partitioning results. Thus, in the example platform shown in FIG. 1B, and in FIGS. 3A through 3C, all the interconnects between sub-FPGAs are static and pre-wired when building the platform. The static, or platform region 140 in each of these figures is fixed in size, as are the dynamic regions 150. The static interconnects need to be abundant to accommodate any anticipated sub-FPGA to sub-FPGA communication. However, in most cases, reserving too much FPGA fabric is a waste of logic area, resulting in more partitions and more difficult sub-FPGA compile jobs. To resolve this problem, in one or more alternate examples, a two level nested region may be used to support dynamic routing between sub-FPGAs. FIG. 6 illustrates an example emulation platform with two level nested sub-FPGA regions.

With reference to FIG. 6, there is shown a single upper level sub-FPGA dynamic region 155, in which are provided eight lower level dynamic sub-FPGA regions 150. However unlike previously described examples, the entire region 440 surrounding the lower level dynamic sub-FPGA regions is dynamic, and, as a result, its size may be optimized for the interconnects that are actually needed. This is not known until an actual partition of the FPGA netlist is done, and mapped to various lower level dynamic sub-FPGA regions. Thus, in one or more examples, in a partitioning stage, a full FPGA netlist is split into sub-FPGA netlists, and the sub-FPGA netlists are assigned into sub-FPGA regions. Next, a dedicated global routing step is introduced to route all the interconnects between the sub-FPGAs, using the reserved FPGA fabric area 440 in FIG. 6, shown with dotted shading. This is a key difference from the base platform described above, in which the interconnects between sub-FPGAs are fixed. After global routing, the upper level dynamic region 155 is implemented and the bitstream is generated. Then multiple compile jobs are called in parallel for all sub-FPGA netlists. In the end platform bitstream, and upper level region 155 bitstream, and several multiple sub-FPGA region 150 bitstreams are loaded together into the full FPGA.

The advantage of the example of FIG. 6 is that it may maximize the usage of the fabric routing area based on the true interconnect numbers between sub-FPGAs, which can only be obtained after a given design/netlist is actually partitioned. This avoids the excessive pre-fixed interconnects for the worst case that are used in the base platform of FIGS. 1B, and 3A-3C, described above. It is noted that a method of dynamic global routing using the nested sub-FPGA dynamic regions is illustrated in FIG. 8 and described below.

Figure 8:
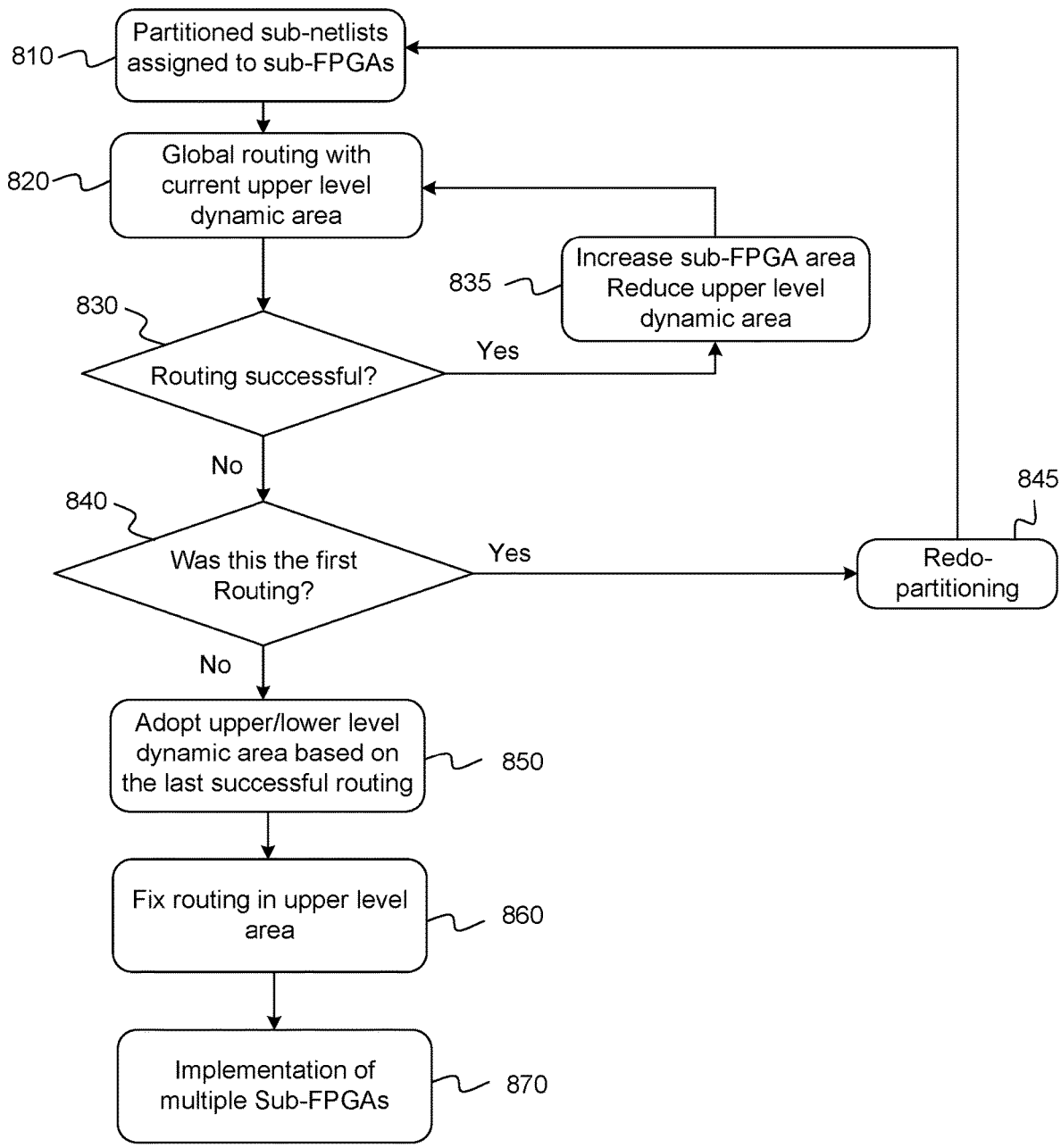
FIG. 8 is a flow diagram of a method for dynamic global routing with nested regions, according to an example.

FIG. 7 illustrates the example two level nested region sub-FPGA platform of FIG. 8, with the addition of multiplexing 152 between individual regions, according to an example. With reference to FIG. 7, the eight individual lower level regions 150 have been renamed as 150A, 150B, . . . , 150H. As shown, there is multiplexing 152 between three pairs of regions, namely 150B and 150D, 150C and 150E, and 150G and 150H. These pair specific connections off-load these inter-lower level region communications from the global routing interconnects, and thus decrease the number of global interconnects that are required. This, in turn, allows for larger lower level units 150, as less of the dynamic fabric 440 is needed for interconnects.

FIG. 8 is a flow diagram of a method of dynamic global routing with nested regions, such as are shown in the example of FIG. 6, for example, according to an example. Continuing with reference to FIG. 8, method 800 includes blocks 810 through 870. In alternate examples method 800 may include greater, or fewer, blocks. Method 800 begins at block 810, where a there are a set of partitioned netlists that are assigned to sub-FPGAs of a of a platform, such as, for example, the FPGA of FIG. 6 or 7. From block 810 method 800 proceeds to block 820, where global routing is performed, using the upper level dynamic area, such as are 440 of FIG. 6. From block 820 method 800 proceeds to query bock 830, where it is determined if the routing of block 820 was successful. As used herein, and in the claims, a routing is referred to as being "successful" if all of the interconnects between elements can find a path on the FPGA fabric to connect without overlapping routing resources. If "No" at query block 830, and the routing was not successful, then method 800 proceeds to query block 840, where it is determined if the global routing of block 820 was the first routing performed for this set of partitioned sub-netlists. If "No" at query block 840, then there has been a prior routing that was successful, which had returned a "Yes" at query block 830. As a result, when the response is "No" at query block 840, method 800 proceeds to block 850, where the areas of the upper and lower dynamic regions for the last successful routing is adopted, and method 800 proceeds to blocks 860 and 870, where, respectively, the routing is fixed in the upper level, and the multiple sub-FPGA regions are implemented in the FPGA.

Continuing with reference to FIG. 8, if, however, the response at query block 830 was "Yes", then it may be possible to reduce the area needed for interconnects in the upper level, so method 800 proceeds to block 835, where the lower level sub-FPGA areas are increased, and the upper level dynamic area is decreased. From block 835, method 800 then returns to block 820, to repeat the inner loop, and thus perform another global routing process using the new relative size of the upper and lower dynamic areas. Similarly, if the response at query block 840 is a "Yes", so that this is the first routing of this set of sub-netlists on the assigned sub-FPGA regions, then method 800 proceeds to block 845, where the partitioning is redone and method 800 then returns to block 810, to globally reroute using the redone partitioning of block 845. After various passes through the inner and outer loops of FIG. 8, an efficient partitioning and a global routing optimized for that partitioning, are obtained. It is noted that at block 845, the redoing of partitioning includes adjusting of the partitioning algorithm parameters to find a different, or better, partitioning result, such that the global routing can be successful, as tested at query block 830. Otherwise there will be no solution, as even the first routing trial fails.

Figure 9:
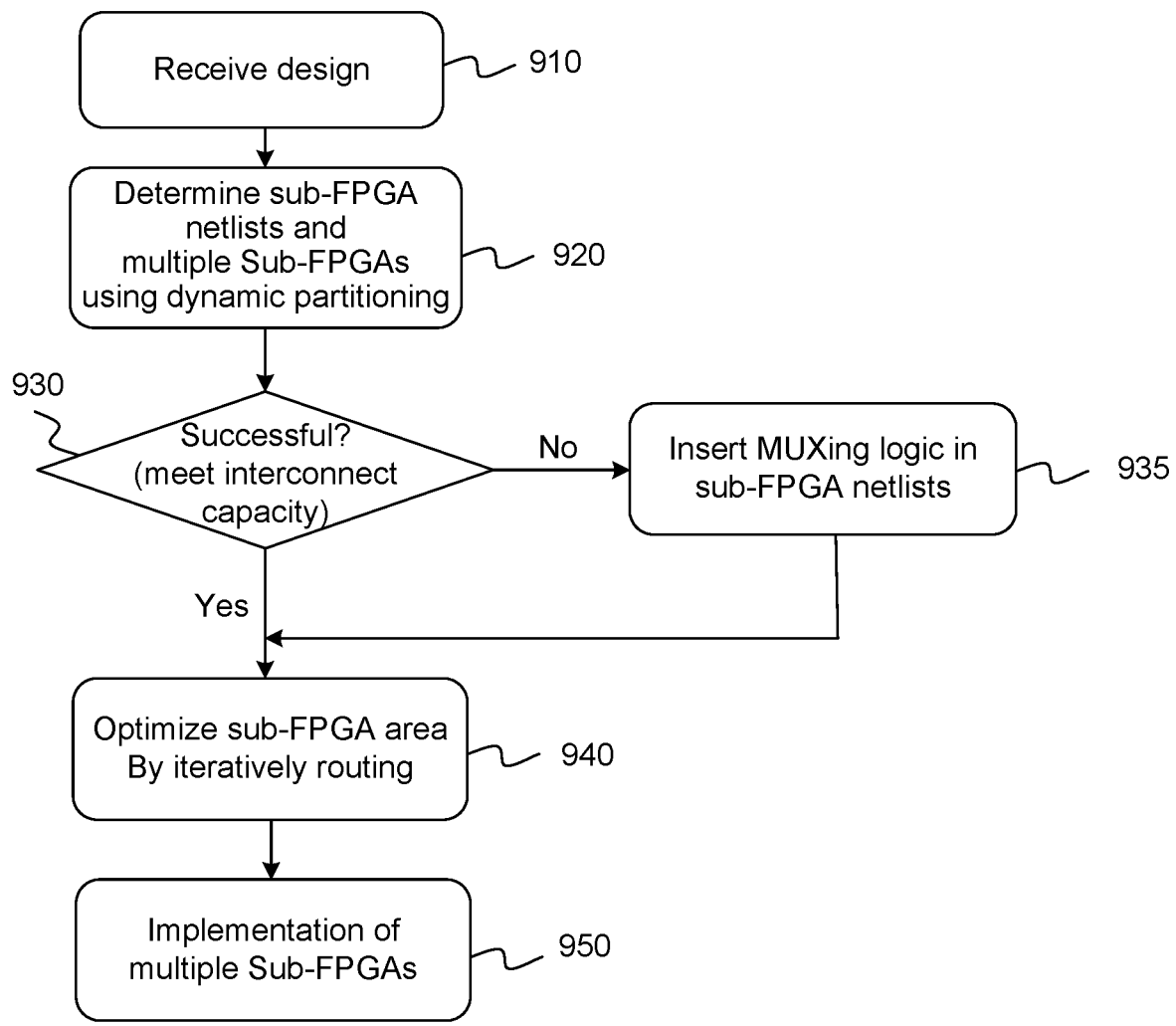
FIG. 9 is a flow diagram of a method of overall compilation with dynamic region size control, multiplexing generation, and sub-FPGA area optimization, according to an example.

FIG. 9 is a flow diagram of a method 900 of overall compilation flow with dynamic region size control, multiplexing generation, and sub-FPGA area optimization, according to an example. Method 900 assumes the example of FIG. 7, where in addition to nested dynamic regions, it is also supported to provide multiplexing between pairs of specific individual sub-FPGA lower regions. Continuing with reference to FIG. 9, method 900 includes blocks 910 through 950. In alternate examples method 900 may include greater, or fewer, blocks. Method 900 begins at block 910, where a design is received. For example, this may be a full netlist for a FPGA based emulation system. From block 910 method 900 proceeds to block 920, where sub-FPGA netlists and multiple sub-FPGAs are determined using dynamic partitioning, such as, for example, is illustrated in method 800 of FIG. 8, described above.

Continuing with reference to FIG. 9, from block 920, method 900 proceeds to query block 930, where it is determined if the partitioning as assigned to sub-FPGA regions of block 920 was successful, as meeting the internet capacity of the upper level. If "No" at query block 930, and the partitioning scheme was not successful, then method 900 proceeds to block 935, where multiplexing logic is inserted in sub-FPGA netlists so as to allow specific pairs of sub-FPGA lower level regions to have their own communication pathways. Such pair-specific pathways are useful when the two sub-FPGA regions are assigned two parts of a previously integrated single larger netlist that was split into two, for example, such as is illustrated in block 535 of FIG. 5.

Once the multiplexing logic has been inserted in the sub-FPGA netlists at block 935, method 900 proceeds to block 940, where the various sub-FPGA areas are optimized by iteratively routing, and then method 900 proceeds to block 950 where the multiple sub-FPGAs are implemented. Method 900 terminates at block 950.

Thus, in one or more examples, methods are provided for large FPGA compilation for emulation/prototyping systems. In some examples a dynamic configuration tool may be adopted to build a platform consisting of multiple nested sub-FPGA regions. A partitioning process divides a full FPGA netlist into sub-FPGA netlists, and dynamically determines sub-FPGA region size. A global routing process may then be called to implement interconnects between sub-FPGAs. Each sub-FPGA may be compiled under an abstract shell mode to save compile time. In addition, hierarchical sub-FPGA regions may be used to give a partitioner flexibility in determining sub-FPGA netlist size. Furthermore, global routing between sub-FPGAs may be implemented after partitioning using nested region technology. Once this has been accomplished, all of the sub-FPGA compilation jobs can be run in parallel, thereby realizing a significant time savings.

Compared to current full FPGA compilation, in simulations run by the inventors flows according to one or more examples were seen to achieve a 3×-5× reduction in compile time. It is noted that this makes FPGA-based emulation/prototyping systems according to one or more examples competitive on compile time while maintaining a twofold or more performance advantage over ASIC based emulation systems.

While the foregoing is directed to embodiments of the present invention, other and further embodiments of the invention may be devised without departing from the basic scope thereof, and the scope thereof is determined by the claims that follow.

What is claimed is:

1. A method of FPGA compilation for a multiple level FPGA, comprising:

partitioning an FPGA netlist into a first set of sub-FPGA netlists, such that each sub-FPGA netlist in the set fits within an upper level dynamic sub-FPGA region of a plurality of upper level dynamic sub-FPGA regions;

for each sub-FPGA netlist in the set:

further partitioning the sub-FPGA netlist into sub-sub-FPGA netlists;

determining if a number of interconnects between the sub-sub-FPGA netlists is below a pre-defined capacity;

adopting the further partitioning if an interconnects capacity is met, and assigning the sub-sub netlists to a lower level dynamic sub-FPGA region; and rejecting the further partitioning if the interconnect capacity is exceeded, and assigning the sub-FPGA netlist to the upper level dynamic sub-FPGA region;

obtaining a final partitioning comprising upper level sub-FPGA netlists and lower level sub-FPGA netlists;

using at least one of the upper level sub-FPGA netlists or the lower level sub-FPGA netlists to obtain a corresponding set of sub-FPGA bitstreams; and loading the set of sub-FPGA bitstreams into the FPGA.

2. The method of claim 1, wherein the upper level dynamic sub-FPGA regions are SLR based.

3. The method of claim 1, wherein the lower level dynamic sub-FPGA regions are nested within the upper level dynamic sub-FPGA regions, and wherein there are two or more lower level dynamic sub-FPGA regions provided in each upper level dynamic sub-FPGA region.

4. The method of claim 1, further comprising at least one of:

performing global routing based on the final partitioning; and performing global routing based on the final partitioning and implementing interconnects based upon the final partitioning in the plurality of upper level dynamic sub-FPGA regions.

* * * * *